(12) United States Patent
Cho et al.

(10) Patent No.: US 10,896,957 B2
(45) Date of Patent: Jan. 19, 2021

(54) SEMICONDUCTOR DEVICES

(71) Applicant: SAMSUNG ELECTRONICS CO., LTD., Suwon-si (KR)

(72) Inventors: Namkyu Edward Cho, Seongnam-si (KR); Seung Soo Hong, Incheon (KR); Geum Jung Seong, Seoul (KR); Seung Hun Lee, Hwaseong-si (KR); Jeong Yun Lee, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/992,401

(22) Filed: May 30, 2018

(65) Prior Publication Data

US 2019/0288065 A1    Sep. 19, 2019

(30) Foreign Application Priority Data

Mar. 14, 2018  (KR) .................. 10-2018-0029753

(51) Int. Cl.
*H01L 29/08*   (2006.01)
*H01L 21/02*   (2006.01)
*H01L 29/06*   (2006.01)
*H01L 27/02*   (2006.01)
*H01L 21/8238* (2006.01)
*H01L 21/311*  (2006.01)
*H01L 21/306*  (2006.01)
(Continued)

(52) U.S. Cl.
CPC .... *H01L 29/0847* (2013.01); *H01L 21/02532* (2013.01); *H01L 21/02576* (2013.01); *H01L 21/02579* (2013.01); *H01L 21/02636* (2013.01); *H01L 21/30604* (2013.01); *H01L 21/31111* (2013.01); *H01L 21/823814* (2013.01); *H01L 21/823821* (2013.01); *H01L 21/823828* (2013.01); *H01L 27/0207* (2013.01); *H01L 27/0924* (2013.01); *H01L 27/1104* (2013.01); *H01L 29/0649* (2013.01); *H01L 29/0869* (2013.01); *H01L 29/165* (2013.01); *H01L 29/7848* (2013.01)

(58) Field of Classification Search
CPC ... H01L 29/66795–66818; H01L 29/785–792; H01L 21/823431; H01L 21/823821; H01L 27/0886; H01L 21/02532–02636; H01L 21/823425; H01L 29/0688; H01L 29/0847
See application file for complete search history.

(56) References Cited

U.S. PATENT DOCUMENTS 9,431,540 B2   8/2016  Liu et al.
9,601,575 B2   3/2017  Jung et al.
(Continued)

*Primary Examiner* — Eric A. Ward
*Assistant Examiner* — Eric K Ashbahian
(74) *Attorney, Agent, or Firm* — Lee IP Law, P.C.

(57) ABSTRACT

A semiconductor device includes fin patterns on a substrate, at least one gate electrode intersecting the fin patterns, source/drain regions on upper surfaces of the fin patterns, and at least one blocking layer on a sidewall of a first fin pattern of the fin patterns, the at least one blocking layer extending above an upper surface of the first fin pattern of the fin patterns, wherein a first source/drain region of the source/drain regions that is on the upper surface of the first fin pattern has an asymmetric shape and is in direct contact with the at least one blocking layer.

18 Claims, 14 Drawing Sheets

(51) Int. Cl.
*H01L 27/11* (2006.01)
*H01L 29/165* (2006.01)
*H01L 29/78* (2006.01)
*H01L 27/092* (2006.01)

(56) References Cited

U.S. PATENT DOCUMENTS

| | | |
|---|---|---|
| 9,640,533 B2 | 5/2017 | Lim et al. |
| 9,748,245 B1 | 8/2017 | Cheng et al. |
| 10,163,635 B1 * | 12/2018 | Qi .................... H01L 21/823431 |
| 10,269,932 B1 * | 4/2019 | Arya ................... H01L 29/7851 |
| 2016/0163826 A1 * | 6/2016 | Cheng ................ H01L 29/66636 257/401 |
| 2016/0315081 A1 * | 10/2016 | Park .................... H01L 27/0886 |
| 2016/0315146 A1 * | 10/2016 | Jung ................... H01L 29/1608 |
| 2016/0315172 A1 * | 10/2016 | Wu ..................... H01L 29/0847 |
| 2017/0098648 A1 | 4/2017 | Lee et al. |
| 2017/0162576 A1 * | 6/2017 | Kim .................... H01L 27/0924 |
| 2017/0207126 A1 | 7/2017 | Ching et al. |
| 2017/0345933 A1 * | 11/2017 | Fung .................. H01L 21/02532 |
| 2018/0145175 A1 * | 5/2018 | Huang ................ H01L 29/7848 |
| 2018/0151439 A1 * | 5/2018 | Huang ............ H01L 21/823418 |
| 2018/0151564 A1 * | 5/2018 | Lee ................. H01L 21/823481 |
| 2018/0175046 A1 * | 6/2018 | Chiou ................ H01L 27/1104 |
| 2019/0006491 A1 * | 1/2019 | Lee .................. H01L 21/02609 |
| 2019/0035933 A1 * | 1/2019 | Lo ........................ H01L 29/785 |

* cited by examiner

SEMICONDUCTOR DEVICES

CROSS-REFERENCE TO RELATED APPLICATION

Korean Patent Application No. 10-2018-0029753, filed on Mar. 14, 2018, in the Korean Intellectual Property Office, and entitled: "Semiconductor Devices," is incorporated by reference herein in its entirety.

BACKGROUND

1. Field

The present disclosure relates to semiconductor devices and methods of forming the same.

2. Description of the Related Art

As demand for high-performance, high-speed, and/or multifunctional semiconductor devices increases, the degree of integration of semiconductor devices has also increased. In manufacturing semiconductor devices having micropatterns in line with a trend for high degrees of integration in semiconductor devices, it is necessary to implement patterns having fine widths and spacings. Semiconductor devices including FinFETs with three-dimensional channels are being developed in order to overcome limitations in device characteristics due to the miniaturization of planar metal oxide semiconductor FETs (MOSFETs).

SUMMARY

An aspect of the present disclosure provides a semiconductor device, including fin patterns on a substrate, at least one gate electrode intersecting the fin patterns, source/drain regions on upper surfaces of the fin patterns, and at least one blocking layer on a sidewall of a first fin pattern of the fin patterns, the at least one blocking layer extending above an upper surface of the first fin pattern of the fin patterns, wherein a first source/drain region of the source/drain regions that is on the upper surface of the first fin pattern has an asymmetric shape and is in direct contact with the at least one blocking layer.

Another aspect of the present disclosure provides a semiconductor device, including at least first, second, third, and fourth fin patterns on a substrate, at least one gate electrode intersecting the at least first, second, third, and fourth fin patterns, source/drain regions on upper surfaces of the at least first, second, third, and fourth fin patterns, respectively, first and second source/drain regions of the source/drain regions being on upper surfaces of the first and second fin patterns, respectively, and in contact with each other to define a merged source/drain region, and at least one blocking layer on a sidewall of the first fin pattern, the at least one blocking layer extending above the upper surface of the first fin pattern, wherein the merged source/drain region has an asymmetric shape and is in direct contact with the at least one blocking layer.

Another aspect of the present disclosure provides a semiconductor device, including at least first, second, and third fin patterns on a substrate, at least one gate electrode intersecting the at least first, second, and third fin patterns, source/drain regions on upper surfaces of the at least first, second, and third fin patterns, respectively, a first source/drain region of the source/drain regions being on an upper surface of the first pattern, and being spaced apart from source/drain regions on the second and third fin patterns, and at least one blocking layer on a sidewall of the first fin pattern, the at least one blocking layer extending above the upper surface of the first fin pattern, wherein the first source/drain region of the source/drain regions has an asymmetric shape and is in direct contact with the at least one blocking layer, the first source/drain region having a different conductivity from adjacent source/drain regions on the second and third fin patterns.

Another aspect of the present disclosure provides a method of forming a semiconductor device, including forming fin patterns on a substrate, forming at least one gate electrode intersecting the fin patterns, forming an insulating layer on exposed surfaces of the fin patterns and gate electrodes, etching the insulating layer to form a blocking layer only on a first sidewall of a first fin pattern of the fin patterns, such that the blocking layer extends above an upper surface of the first fin pattern, and forming source/drain regions on upper surfaces of the fin patterns, such that a first source/drain region of the source/drain regions that is on the upper surface of the first fin pattern is formed in direct contact with the blocking layer to have an asymmetric shape.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, example embodiments will be described with reference to the accompanying drawings.

Figure 1:
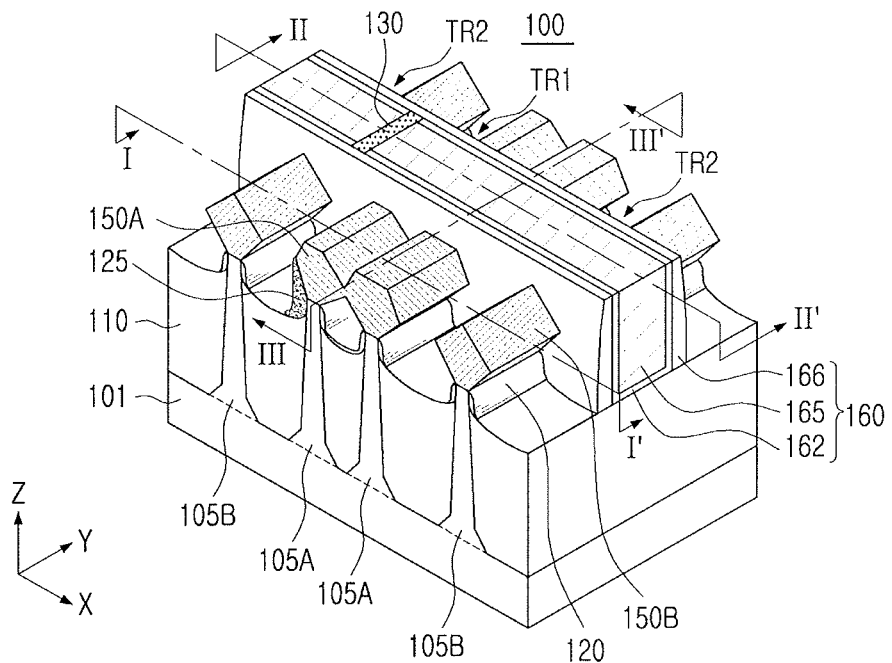
FIG. 1 illustrates a perspective view of a semiconductor device according to example embodiments.
Figure 2A:
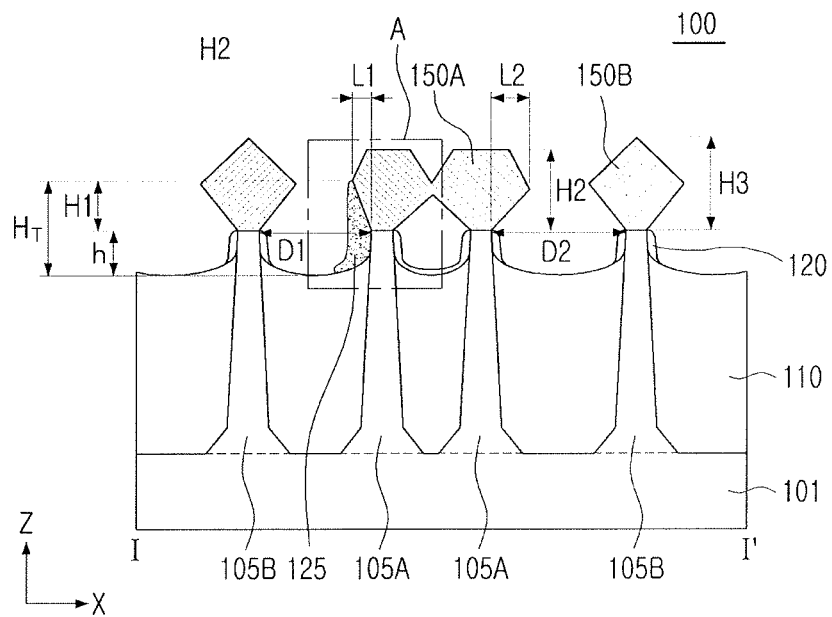
FIGS. 2A to 2C illustrate cross-sectional views along lines I-I', II-II', and III-III' of the semiconductor device illustrated in FIG. 1, respectively.
Figure 2B:
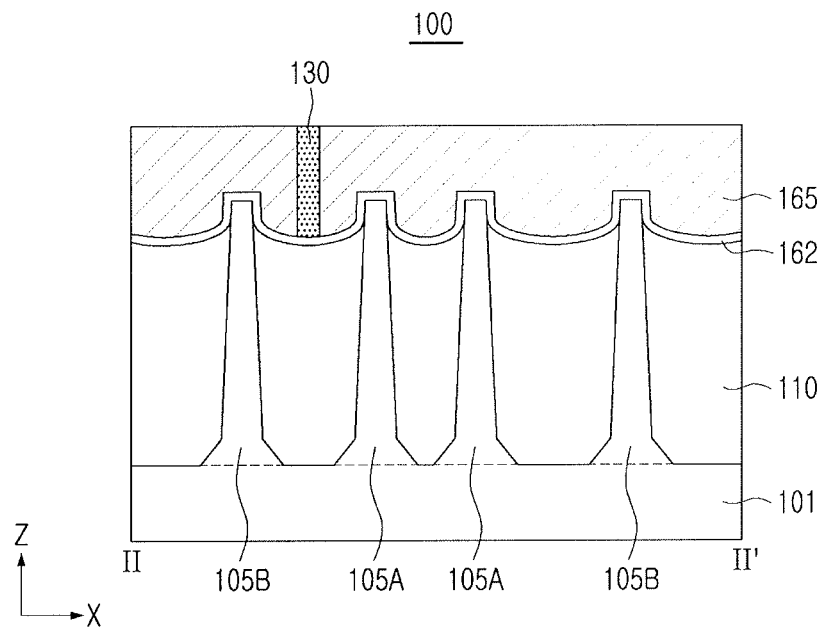
Figure 2C:
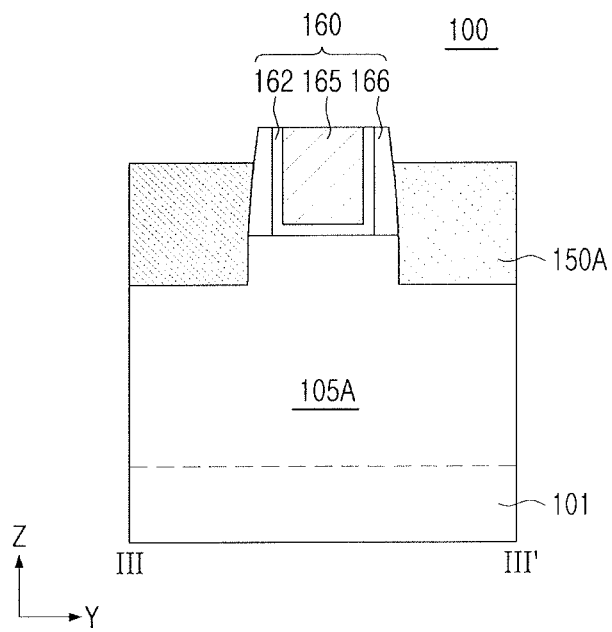

FIG. 1 is a perspective view illustrating a semiconductor device according to example embodiments. FIGS. 2A to 2C are cross-sectional views taken along lines I-I', II-II', and III-III' of the semiconductor device illustrated in FIG. 1, respectively. For convenience of explanation, main components of the semiconductor device are illustrated in FIGS. 1 to 2C.

Referring to FIGS. 1 to 2C, a semiconductor device 100 may include a substrate 101, first and second active fins 105A and 105B, first and second source/drain areas 150A and 150B, a gate structure 160, and blocking layers 125. The gate structure 160 may include a gate dielectric layer 162, a gate electrode 165, and gate spacers 166. The semiconductor device 100 may further include device isolation layers 110, spacers 120, and a gate isolation layer 130.

The semiconductor device 100 may include FinFET devices in which the first and second active fins 105A and 105B have a fin structure. The FinFET devices may include first and second transistors TR1 and TR2 arranged based on the first and second active fins 105A and 105B intersecting the gate structures 160. For example, the first and second transistors TR1 and TR2 may be NMOS and PMOS transistors, respectively.

The substrate 101 may include a top surface extending in an x-direction and a y-direction. The substrate 101 may include a semiconductor material, e.g., a Group IV semiconductor material, a Group III-V compound semiconductor material, or a Group II-VI oxide semiconductor material. For example, the Group IV semiconductor material may include silicon, germanium, or silicon-germanium. The substrate 101 may be provided in a form of a bulk wafer, an epitaxial layer, a silicon on insulator (SOI) layer, or a semiconductor on insulator (SeOI) layer.

The device isolation layers 110 may define the first and second active fins 105A and 105B in the substrate 101. The device isolation layers 110 may be formed, e.g., in a shallow trench isolation (STI) process. In some example embodiments, the device isolation layers 110 may include an area extending more deeply into a lower portion of the substrate 101 between the first active fins 105A and the second active fins 105B. The device isolation layers 110 may have curved top surfaces having a higher level in the vicinity of the first and second active fins 105A and 105B. However, the shape of the top surfaces of the device isolation layers 110 is not limited thereto. The device isolation layers 110 may be formed of an insulating material. The device isolation layers 110 may include, e.g., an oxide, a nitride, or a combination thereof.

The first and second active fins 105A and 105B may be defined by the device isolation layers 110 in the substrate 101, and arranged to extend in a first direction, e.g., in the y-direction. The first and second active fins 105A and 105B may have a structure protruding from the substrate 101. Upper ends of the first and second active fins 105A and 105B may be disposed to protrude from the top surfaces of the device isolation layers 110 to a predetermined height. The first and second active fins 105A and 105B may be formed as a portion of the substrate 101, or may include an epitaxial layer grown from the substrate 101. However, the first and second active fins 105A and 105B may be partially recessed at sides of the gate structures 160 on the substrate 101, and the first and second source/drain areas 150A and 150B may be disposed on the recessed portion of first and second active fins 105A and 105B. Accordingly, as illustrated in FIGS. 2B and 2C, the first and second active fins 105A and 105B may have a relatively large height below the gate structure 160. In some example embodiments, the first and second active fins 105A and 105B may include impurities, and the first active fins 105A and the second active fins 105B may have different conductivity-type impurities from each other, but are not limited thereto.

The first and second source/drain areas 150A and 150B may be respectively disposed on the first and second active fins 105A and 105B on either side of the gate structures 160. Each of the first and second source/drain areas 150A and 150B may be provided as a source area or a drain area of the first and second transistors TR1 and TR2. The first and second source/drain areas 150A and 150B may have an elevated source/drain structure in which top surfaces thereof are disposed higher than bottom surfaces of the gate structures 160, in particular, the gate electrodes 165.

The first source/drain areas 150A may have a different shape from the second source/drain areas 150B. For example, as illustrated in FIG. 2A, the first source/drain areas 150A may have a hexagonal shape, and the second source/drain areas 150B may have a pentagonal shape. However, the first and second source/drain areas 150A and 150B are not limited thereto and may have a variety of shapes. For example, the first and second source/drain areas 150A and 150B may have one of a polygonal shape, a circular shape, or a rectangular shape.

In particular, the first source/drain areas 150A may be connected to or merged with each other on two adjacent first active fins 105A to form one first source/drain area 150A on the two adjacent first active fins 105A. However, the number of first active fins 105A disposed below the connected or merged first source/drain area 150A is not limited to that illustrated in the drawings, and may be variously modified according to example embodiments.

The first source/drain areas 150A may have an asymmetrical shape in the x-direction. As illustrated in FIGS. 1 and 2A, a left side of the first source/drain area 150A may have a relatively small size on the first active fin 105A in contact with the blocking layer 125, since the growth thereof is suppressed by the blocking layer 125. For example, due to contact between the left side of the first source/drain area 150A with the blocking layer 125, the width of the left side of the first source/drain area 150A along the x-direction may be smaller than the width of the right side of the first source/drain area 150A on a same first active fin 105A along the x-direction. For example, due to contact between the left side of the first source/drain area 150A with the blocking layer 125, the width of the left side of the first source/drain area 150A along the x-direction may be smaller than the width of the right side of the first source/drain area 150A on the adjacent first active fin 105A along the x-direction.

In detail, as illustrated in FIG. 2A, a first side of the first source/drain area 150A facing the second active fin 105B may be in contact with the blocking layer 125, and may grow in the x-direction outwardly relatively to a sidewall of the first active fin 105A therebelow to a maximal first length L1. A second side of the first source/drain area 150A opposite the first side may grow in the x-direction outwardly relatively to a sidewall of the first active fin 105A therebelow to a maximal second length L2, greater than the first length L1. A height H2 of the first source/drain areas 150A from top surfaces of the first active fins 105A may be smaller than a height H3 of the second source/drain areas 150B from top surfaces of the second active fins 105B, but is not limited thereto.

The first source/drain areas 150A may be formed of a material having a different conductivity-type from the material of the second source/drain areas 150B. In particular, the first and second source/drain areas 150A and 150B may be formed in an epitaxial layer. For example, the first source/drain areas 150A may include silicon (Si) doped with n-type impurities, and the second source/drain areas 150B may include silicon germanium (SiGe) doped with p-type impurities. When the second source/drain areas 150B include silicon germanium (SiGe), it may apply stress to a channel area of the second transistor TR2, a portion of the second active fins 105B formed of silicon (Si), thereby improving hole mobility. In some example embodiments, the first and second source/drain areas 150A and 150B may include a plurality of areas including elements and/or doping elements with different concentrations.

The spacers 120 and the blocking layers 125 may be disposed on the device isolation layers 110 to be in contact with side surfaces of the first and second active fins 105A and 105B on upper ends of the first and second active fins 105A and 105B.

Upper ends of the spacers 120 may be disposed on the same level as, or on a lower level than, the upper ends of the first and second active fins 105A and 105B. The spacers 120 may have a spacer shape, but are not limited thereto. The shape of the spacers 120 may be variously modified according to manufacturing processes. The spacers 120 may be connected to each other below the first source/drain areas 150A, but are not limited thereto. In some example embodiments, lengths of the spacers 120 extending along top surfaces of the device isolation layers 110 may be variously modified. In some example embodiments, the spacers 120 may be connected to the blocking layers 125.

The blocking layers 125 may be disposed on sides of at least some of the first source/drain areas 150A to extend from the sidewall of the first active fin 105A to side surfaces of the first source/drain areas 150A, e.g., the blocking layer 125 may be disposed on one side of each merged first source/drain area 150A. For example, the blocking layers 125 may be in direct contact with an upper portion of the sidewall of the first active fin 105A and portions of the side surfaces of the first source/drain areas 150A, e.g., the blocking layers 125 may be flush against the first source/drain areas 150A. For example, as illustrated in FIG. 2A, each one of the blocking layer 125 may extend, e.g., continuously, from the device isolation layers 110 along an exposed upper portion of the sidewall of the first active fin 105A and along a portion of the side surface of the first source/drain areas 150A. For example, the blocking layer 125 may be in direct contact with the side surface of the first source/drain areas 150A, e.g., the blocking layer 125 may extend along a side surface of the first source/drain areas 150A up to the height H1. For example, the blocking layer 125 may be continuous along an entire exposed upper portion of the sidewall of the first active fin 105A, e.g., along the z-direction and the y-direction in FIG. 2A, and may extend on an upper portion of the substrate 101 adjacent the exposed upper portion of the sidewall of the first active fin 105A.

The blocking layers 125 may serve to suppress the lateral growth of the first source/drain areas 150A in contact with the blocking layers 125 during the manufacturing process. For example, the blocking layers 125 may ensure that source/drain areas of opposite conductivity, e.g., first and second source/drain areas 150A and 150B of PMOS and MNOS transistors, do not contact each other despite a small distance therebetween. Accordingly, the first source/drain areas 150A in contact with the blocking layers 125 may have the asymmetrical shape, and have a relatively small size, e.g., width, on the side contacting the blocking layers 125, e.g., left side in FIG. 2A. Accordingly, referring to FIG. 2A, even in the case that a distance D1 to an adjacent second active fin 105B disposed at the left side of the first source/drain areas 150A is smaller than a distance D2 to an adjacent second active fin 105B disposed to the right of the first source/drain areas 150A, the first source/drain areas 150A may not contact the second source/drain areas 150B at its left side, due to the blocking layer 125 at the left side of the first source/drain areas 150A that blocks growth of the first source/drain areas 150A to the left.

A height H1 of the blocking layers 125 from the top surfaces of the first active fins 105A may be the same as or smaller than a height to a position at which the first source/drain areas 150A have the maximum width L1 in the lateral direction, i.e., in the x-direction. In some example embodiments, upper ends of the blocking layers 125 may be disposed on the same level as or at a lower level than the height of the first and second active fins 105A and 105B below the gate structure 160. Lower ends of the blocking layers 125 may be spaced apart from the sidewalls of the first active fins 105A and bent in the x-direction to extend along the top surfaces of the device isolation layers 110. Accordingly, the blocking layers 125 may have a chair shape. However, the shape of the blocking layers 125 may be variously modified according to example embodiments, which will be described in more detail with reference to FIGS. 3A and 3B. In some example embodiments, the blocking layers 125 may be formed on the side surfaces of the first source/drain areas 150A disposed at one side of the gate structure 160, not both sides of the gate structure 160.

The spacers 120, the blocking layers 125, and the gate spacers 166 may be material layers formed in the same process but undergoing different subsequent processes. Accordingly, the spacers 120 and the blocking layers 125 may be formed of the same material, and the gate spacers 166 may also be formed of the same material. However, embodiments are not limited thereto. For example, the spacers 120 and the blocking layers 125 may be formed of a low-k material, e.g., at least one of SiO, SiN, SiCN, SiOC, SiON, and SiOCN.

The gate structure 160 may be disposed on the first and second active fins 105A and 105B to intersect the first and second active fins 105A and 105B, e.g., extend in the x-direction. Channel areas of the first and second transistors TR1 and TR2 may be formed in the first and second active fins 105A and 105B intersecting the gate structure 160. The gate structure 160 may include the gate dielectric layer 162, the gate electrode 165, and the gate spacers 166.

The gate dielectric layer 162 may be disposed between the first and second active fins 105A and 105B and the gate electrodes 165, and may cover bottom and side surfaces of the gate electrodes 165. In some example embodiments, the gate dielectric layer 162 may only be formed on the bottom surface of the gate electrode 165. The gate dielectric layer 162 may include an oxide, a nitride, or a high-k material. The high-k material may refer to a dielectric material having a higher dielectric constant than silicon oxide ($SiO_2$). The high-k material may include, e.g., at least one of aluminum oxide ($Al_2O_3$), tantalum oxide ($Ta_2O_3$), titanium oxide ($TiO_2$), yttrium oxide ($Y_2O_3$), zirconium oxide ($ZrO_7$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may include a conductive material. For example, the gate electrode 165 may include a metal nitride, e.g., titanium nitride (TiN), tantalum nitride (TaN), or tungsten nitride (WN), and/or a metal material, e.g., aluminum (Al), tungsten (W), or molybdenum (Mo), or a semiconductor material, e.g., doped polysilicon. The gate electrodes 165 may be formed as a multilayer structure including two or more layers. The gate electrode 165 may be separated by the gate isolation layer 130 between the adjacent transistors TR1 and TR2, according to configurations of the semiconductor device 100.

The gate spacers 166 may be disposed on both side surfaces of the gate electrode 165. The gate spacers 166 may isolate the first and second source/drain areas 150A and 150B from the gate electrodes 165. The gate spacers 166 may have a multilayer structure in some example embodiments. The gate spacers 166 may be formed of, e.g., an oxide, a nitride, or an oxynitride, and in particular, may be formed of a low-k material.

The gate isolation layer 130 may separate the gate electrode 165 between at least portions of the transistors TR1 and TR2. The gate isolation layer 130 may extend in a direction perpendicular to a direction, in which the gate electrode 165 extends, e.g., the y-direction, and serve to separate the gate dielectric layer 162 and the gate electrode 165. A bottom surface of the gate isolation layer 130 may be surrounded by the gate dielectric layer 162, but the arrangement of the gate isolation layer 130 is not limited thereto. In some example embodiments, the gate isolation layer 130 may not separate the gate dielectric layer 162 in the y-direction, or may separate the gate dielectric layer 162 together with at least a portion of the gate spacers 166. Further, the gate isolation layer 130 may include a plurality of layers.

Figure 3A:
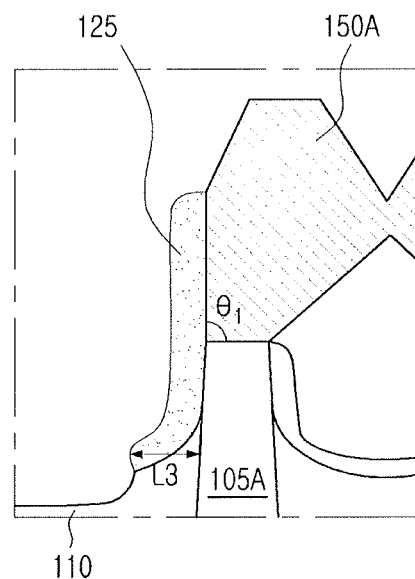
FIGS. 3A and 3B illustrate partially enlarged views of a semiconductor device according to example embodiments.
Figure 3B:
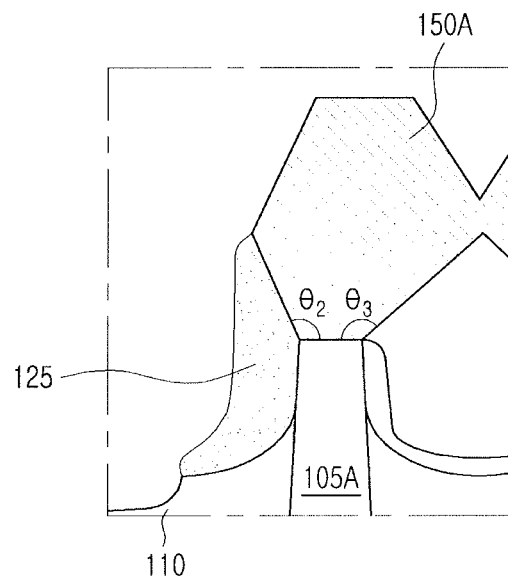

FIGS. 3A and 3B are partially enlarged views illustrating a semiconductor device according to example embodiments. FIGS. 3A and 3B illustrate a region corresponding to region A of FIG. 2A (dashed frame in FIG. 2A).

Referring to FIGS. 3A and 3B, the shape of the blocking layer 125 in contact with the side surface of the first source/drain area 150A may be variously modified according to example embodiments. In some example embodiments, as illustrated in FIG. 3A, an angle ($\theta_1$) formed by a right side surface of the blocking layer 125 and the top surface of the first active fin 105A may be about 90 degrees or smaller. In some example embodiments, as illustrated in FIG. 3B, an angle ($\theta_2$) formed by the right side surface of the blocking layer 125 and the top surface of the first active fin 105A may be greater than 90 degrees, e.g., angles ($\theta_1$) and ($\theta_2$) may be different from each other, and may be the same as or smaller than an angle ($\theta_3$) on the top surface of the same first active fin 105A and adjacent to angle ($\theta_2$), i.e., the angle ($\theta_3$) may be also an angle of the first source/drain area 150A grown on the adjacent first active fin 105A and not contacting the blocking layer 125.

Thicknesses of an upper end portion, a center portion, and a lower end portion of the blocking layer 125 may be variously changed according to example embodiments. In addition, a length L3 of the lower end portion of the blocking layer 125 laterally extending from the sidewall of the first active fin 105A may also be variously changed according to example embodiments. As illustrated in FIGS. 3A and 3B, the top surface of a device isolation layer 110 may have differently curved surfaces with an end of the blocking layer 125 as a boundary. Such a shape may be due to an upper portion of the device isolation layer 110 which the blocking layer 125 does not cover being partially etched during the manufacturing process.

Figure 4:
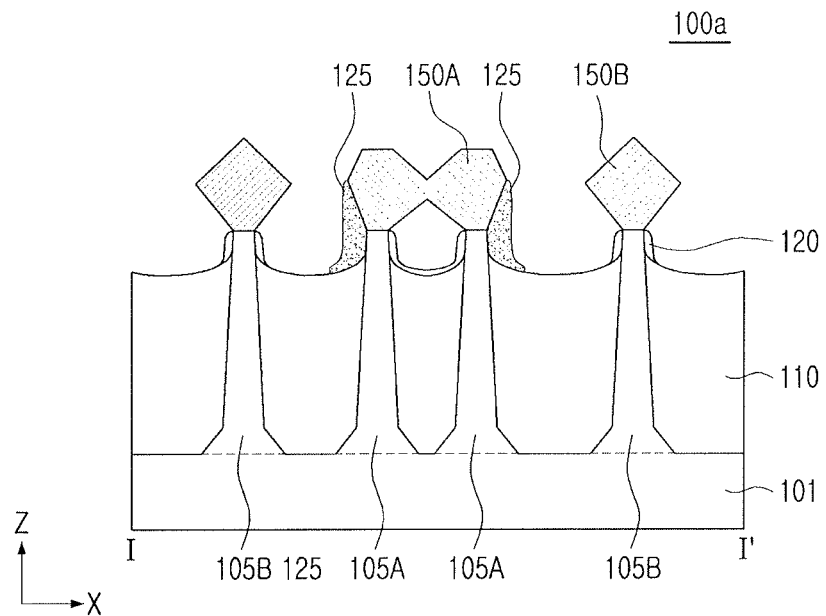
FIGS. 4 to 6 illustrate cross-sectional views of a semiconductor device according to example embodiments.
Figure 5:
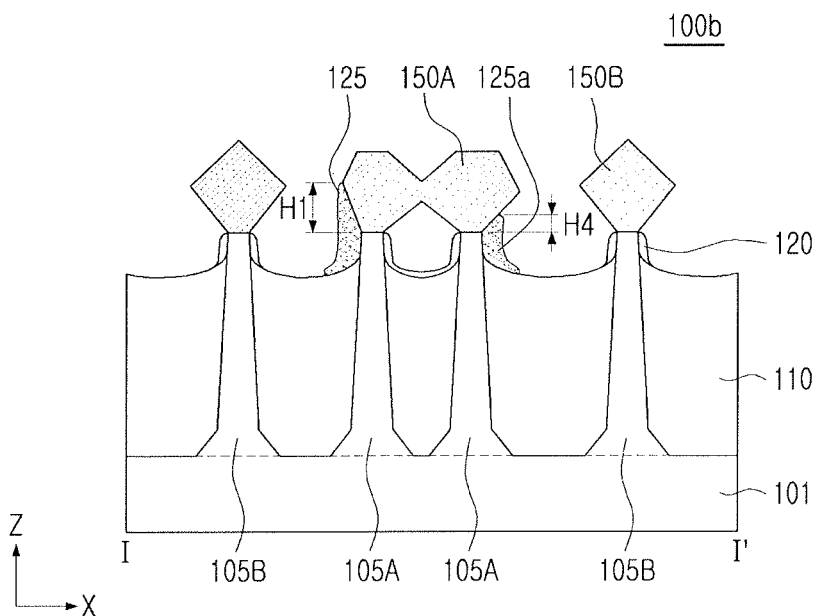
Figure 6:
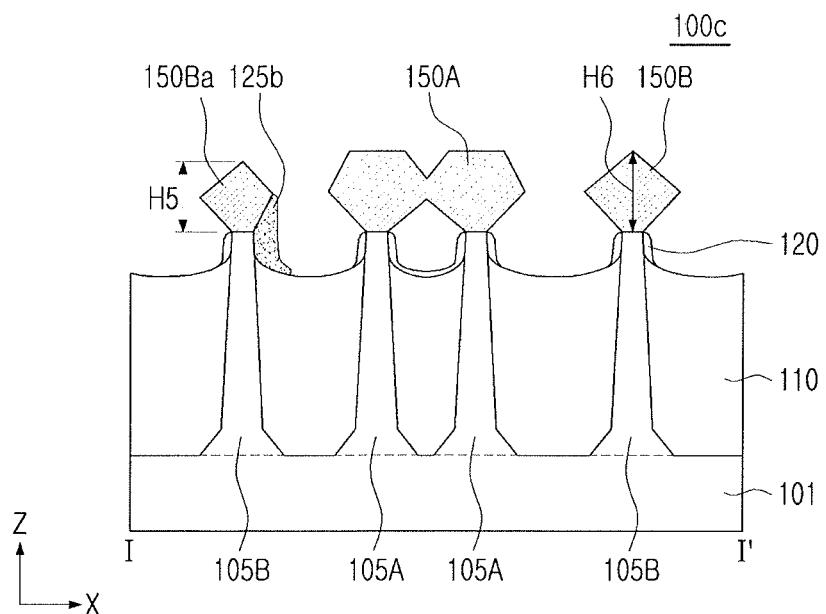

FIGS. 4 to 6 are cross-sectional views illustrating a semiconductor device according to example embodiments. FIGS. 4 to 6 illustrate cross-sectional regions corresponding to those illustrated in FIG. 2A.

Referring to FIG. 4, blocking layers 125 may be symmetrically disposed on both sides of the first source/drain area 150A in a semiconductor device 100a. Accordingly, a shape of the first source/drain area 150A may also be symmetrical in the x-direction. For example, when it is necessary to prevent the first source/drain area 150A from being in contact with the second source/drain areas 150B disposed on both sides thereof, the blocking layers 125 may be disposed on both sides of the first source/drain area 150A.

Referring to FIG. 5, blocking layers 125 and 125a may be asymmetrically disposed on both sides of the first source/drain area 150A in a semiconductor device 100b. Accordingly, a shape of the first source/drain area 150A may also be asymmetrical in the x-direction. For example, the blocking layer 125 disposed to the left of the first source/drain area 150A may extend from a top surface of the first active fin 105A to the first height H1, and the blocking layer 125a disposed to the right of the first source/drain area 150A may extend from the top surface of the first active fin 105A to a height H4 lower than the first height H1. In this case, the growth of the first source/drain area 150A may be suppressed in the left direction more than in the right direction, when the first source/drain area 150A is formed. Accordingly, the first source/drain area 150A may have the asymmetrical shape.

Referring to FIG. 6, a blocking layer 125b may be disposed at one side of a second source/drain area 150B in a semiconductor device 100c. The blocking layer 125b may be disposed to extend from a sidewall of a second active fin 105B to a side surface of the second source/drain area 150B. Accordingly, the blocking layer 125b may be in direct contact with an upper portion of the sidewall of the second active fin 105B and a portion of the side surface of the second source/drain area 150B. The second source/drain area 150B in contact with the blocking layer 125b may have an asymmetrical shape in the x-direction, and have a smaller size than the second source/drain area 150B that is not in contact with the blocking layer 125b. For example, a height H5 of the second source/drain area 150B in contact with the blocking layer 125b from the second active fin 105B may be the same as or a smaller than a height H6 of the second source/drain area 150B and the first source/drain area 150A respectively from the second active fin 105B and the first active fin 105A, but is not limited thereto.

Figure 7:
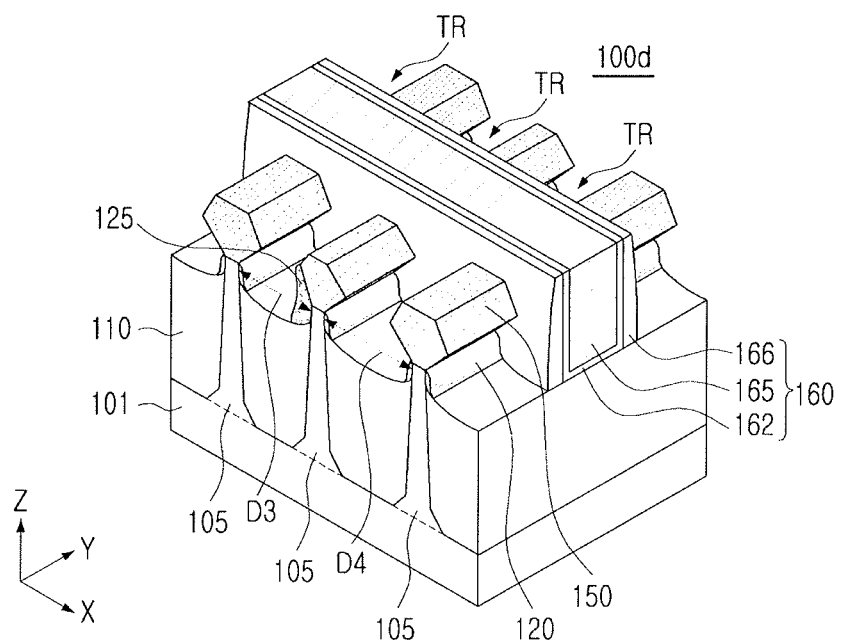
FIG. 7 illustrates a perspective view of a semiconductor device according to example embodiments.

FIG. 7 is a perspective view illustrating a semiconductor device according to example embodiments.

Referring to FIG. 7, a semiconductor device 100d may include the substrate 101, active fins 105, the device isolation layers 110, source/drain areas 150, the gate structure 160, the blocking layers 125, and the spacers 120. The gate structure 160 may include the gate dielectric layer 162, the gate electrode 165, and the gate spacers 166. The semiconductor device 100d may include transistors TR arranged based on the active fins 105 and the gate structure 160. For example, the transistors TR may include at least one of NMOS and PMOS transistors.

In the semiconductor device 100d, a single source/drain area 150 may be disposed on a single active fin 105, unlike the merged source/drain area disposed on two adjacent active fins illustrated in FIG. 1. The blocking layers 125 may be disposed on side surfaces of portions of the source/drain areas 150. For example, when a distance from a center active fin 105 to an adjacent left active fin 105, i.e., distance D3 in FIG. 7, is smaller than a distance from the center active fin 105 to an adjacent right active fin 105, i.e., distance D4 in FIG. 7, the blocking layers 125 may be disposed on a left sidewall of the center active fin 105 to minimize growth of the source/drain areas 150 on the center active fin 105 to the left, i.e., where the distance D3 is smaller. In this case, the source/drain areas 150 in contact with the blocking layer 125 may have an asymmetrical shape since the growth thereof may be suppressed in a leftward direction, and may have a relatively small size compared to an adjacent source/drain areas 150, i.e., not contacting any blocking layers.

As described above with reference to FIGS. 4 to 7, the arrangement of the blocking layer 125 may be variously modified in consideration of the arrangement, connecting relationships, and functions of the transistors in the semiconductor device.

Figure 8A:
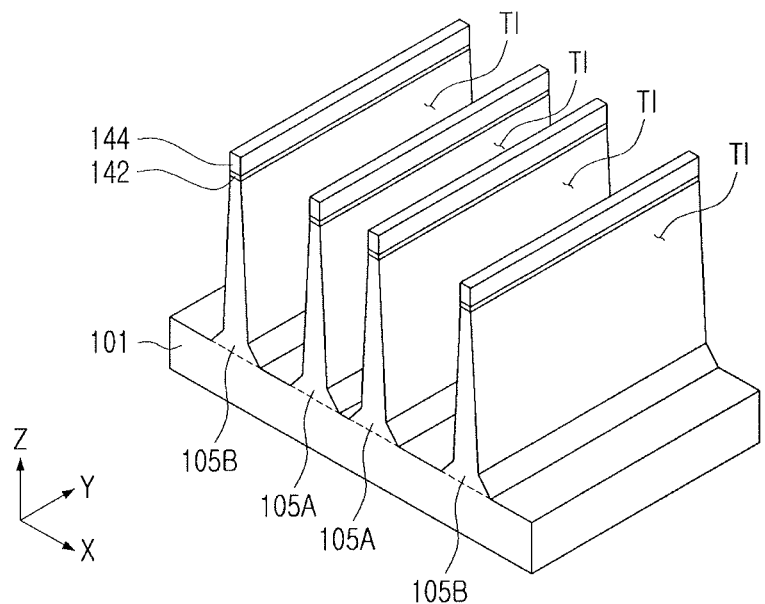
FIGS. 8A to 8N illustrate process diagrams of stages in a method of fabricating a semiconductor device according to example embodiments.
Figure 8B:
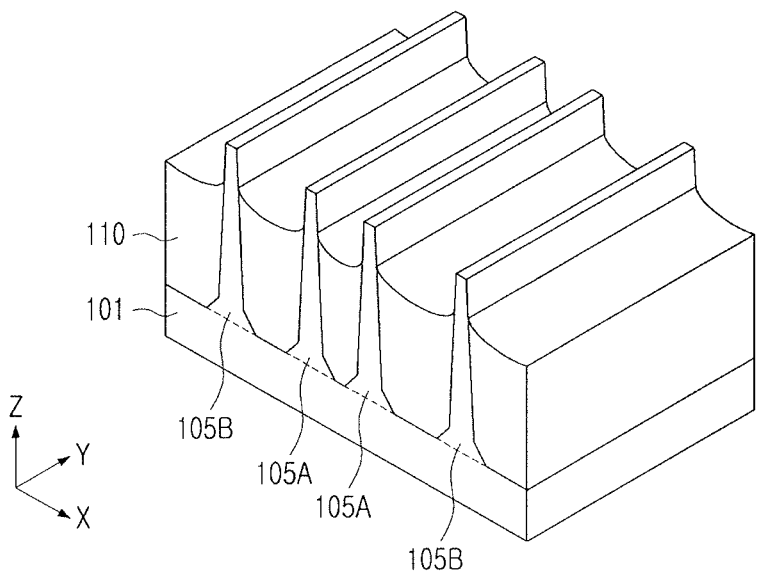
FIG. 8O illustrates a graph of a schematic correlation between a height of a blocking layer and distance D5.
Figure 8C:
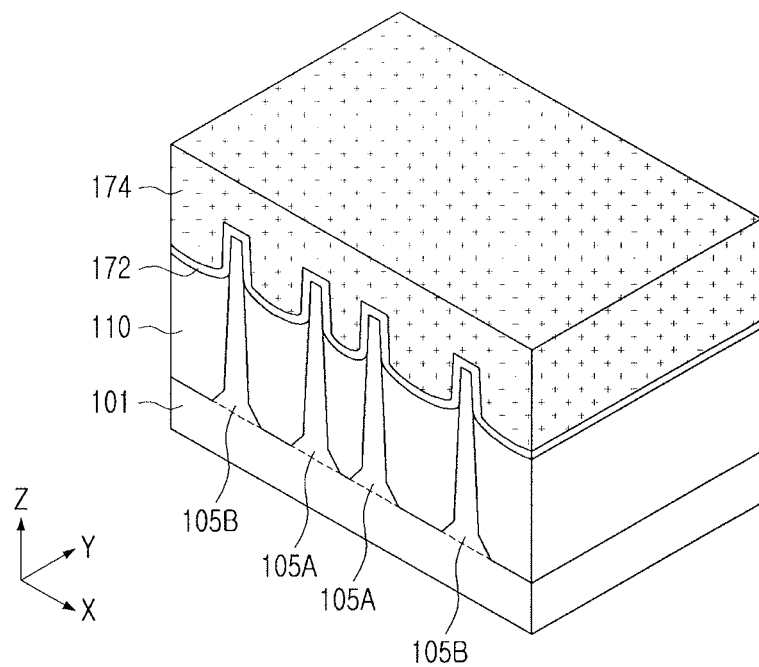
Figure 8D:
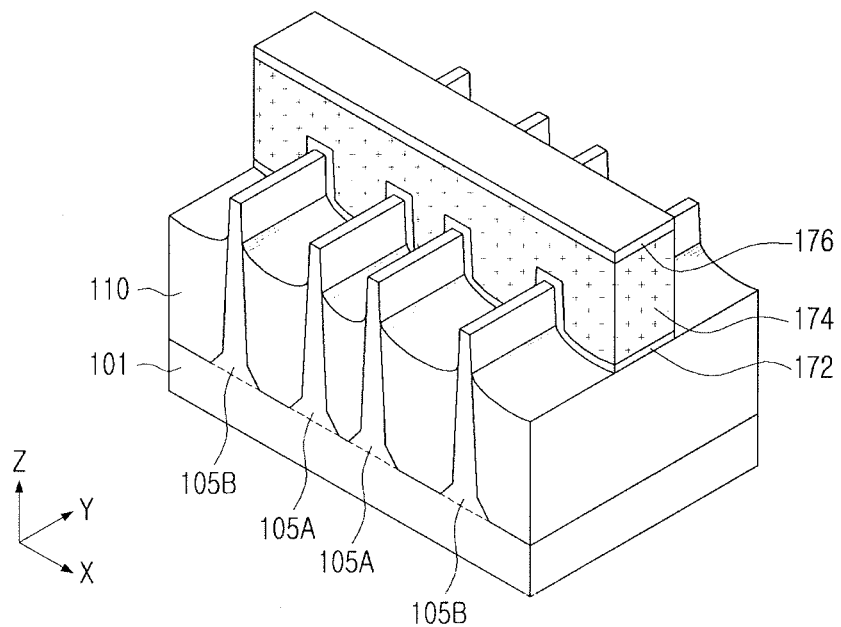
Figure 8E:
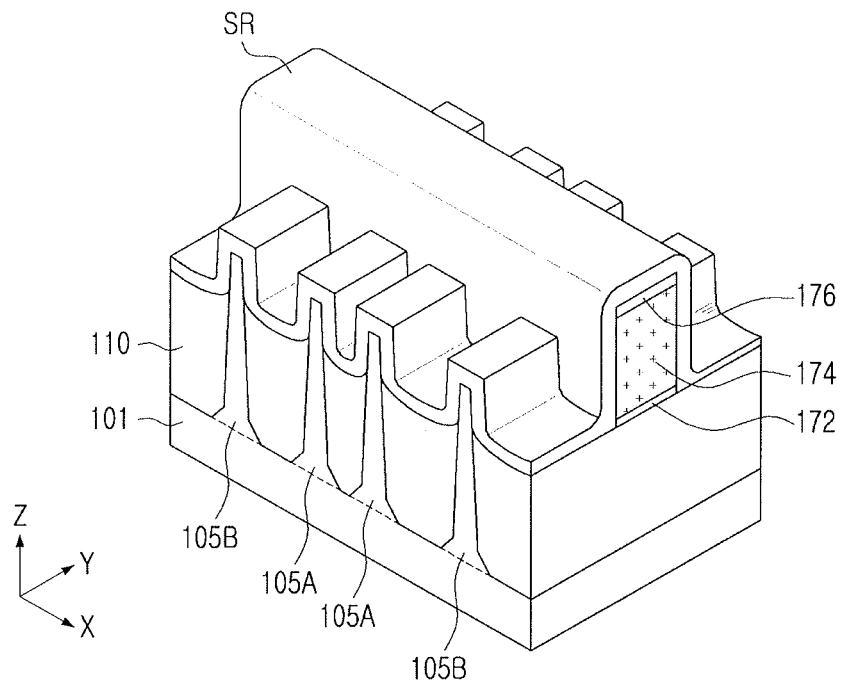
Figure 8F:
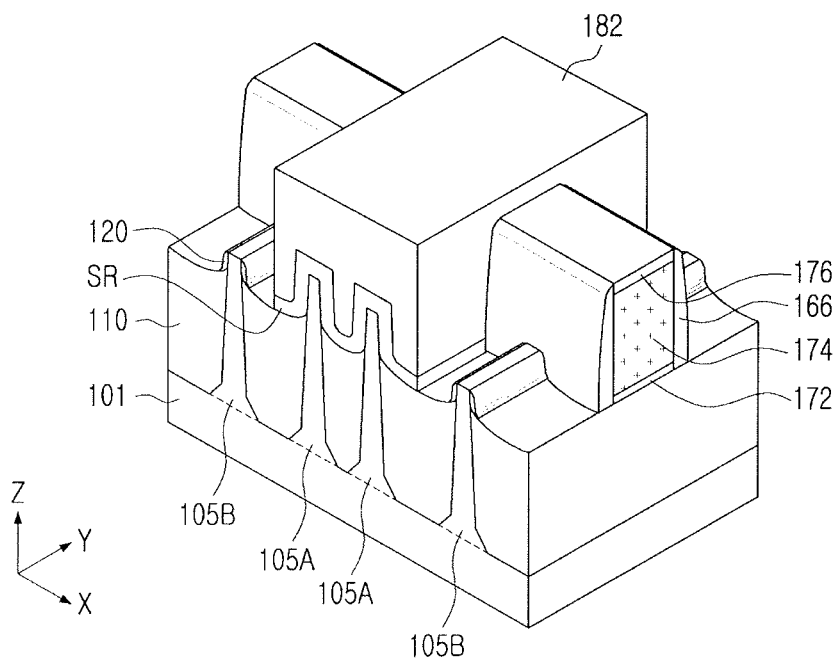
Figure 8G:
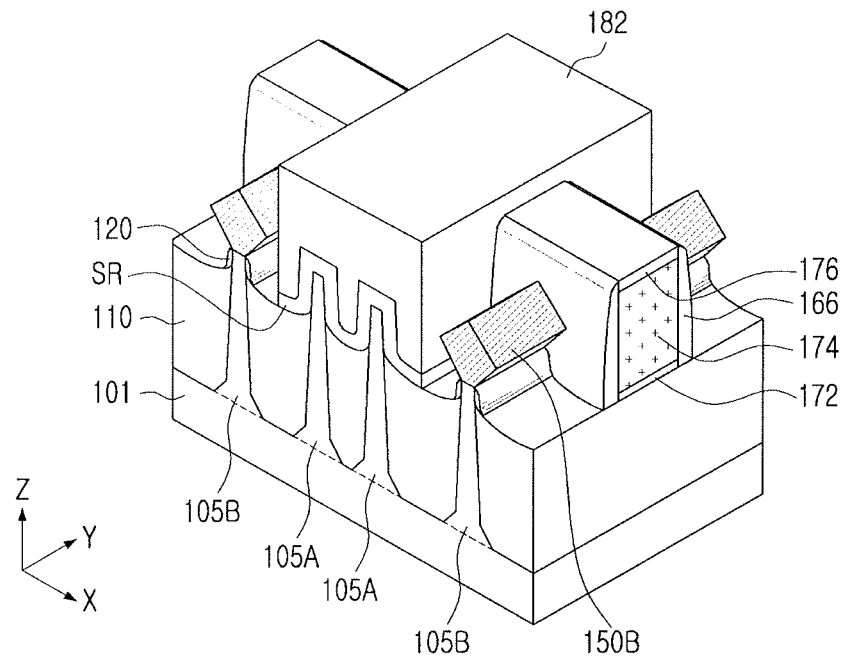
Figure 8H:
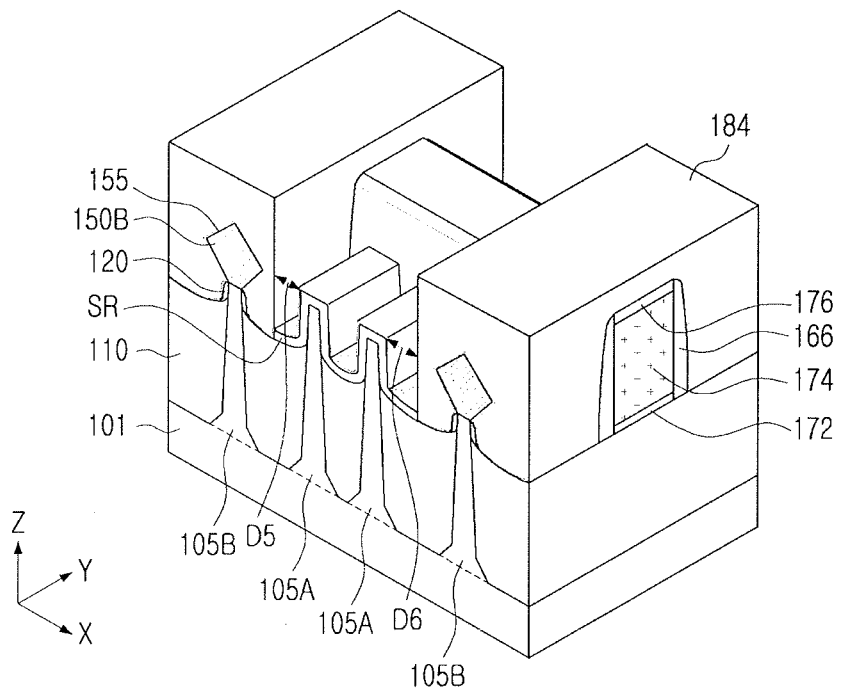
Figure 8I:
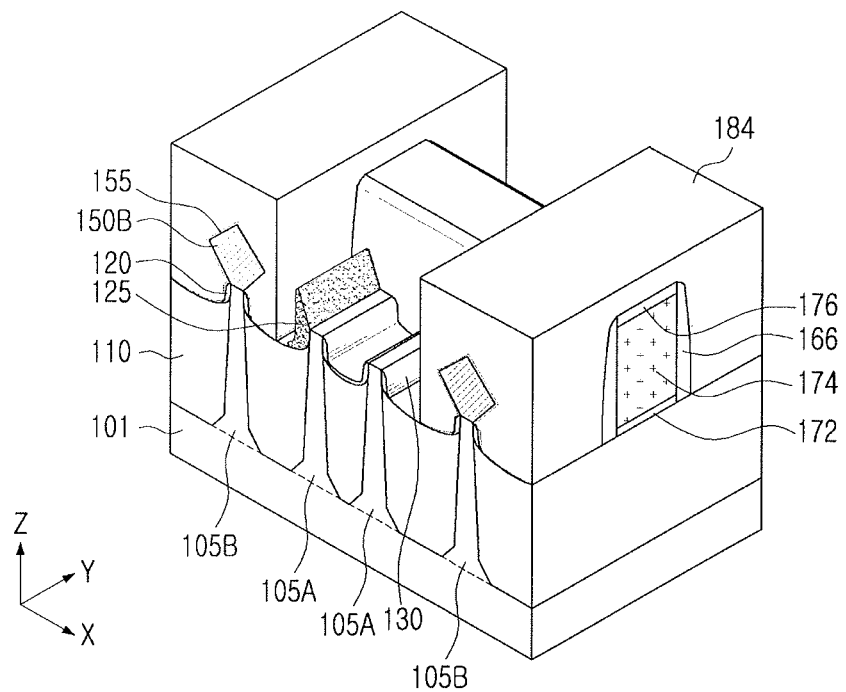
Figure 8J:
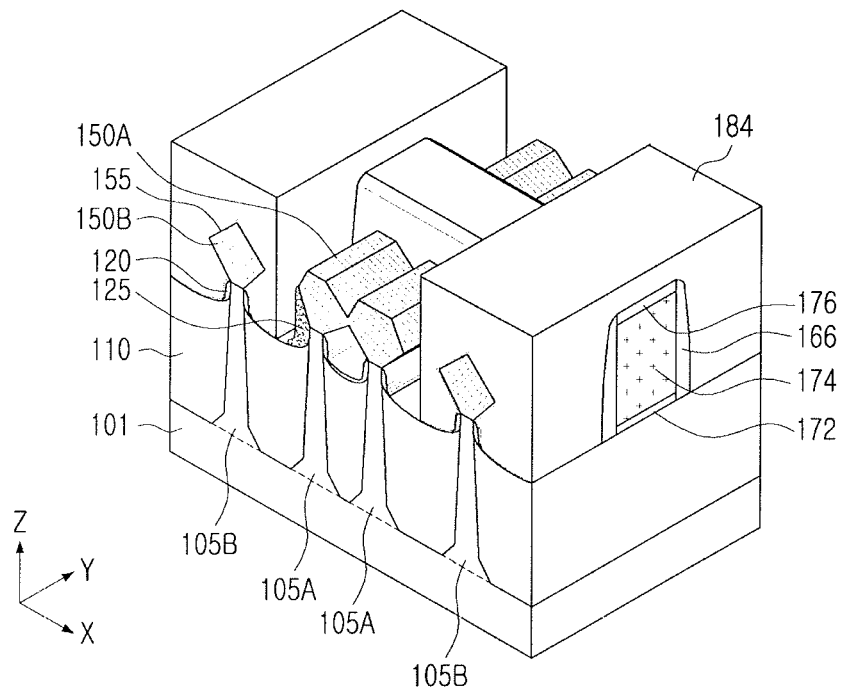
Figure 8K:
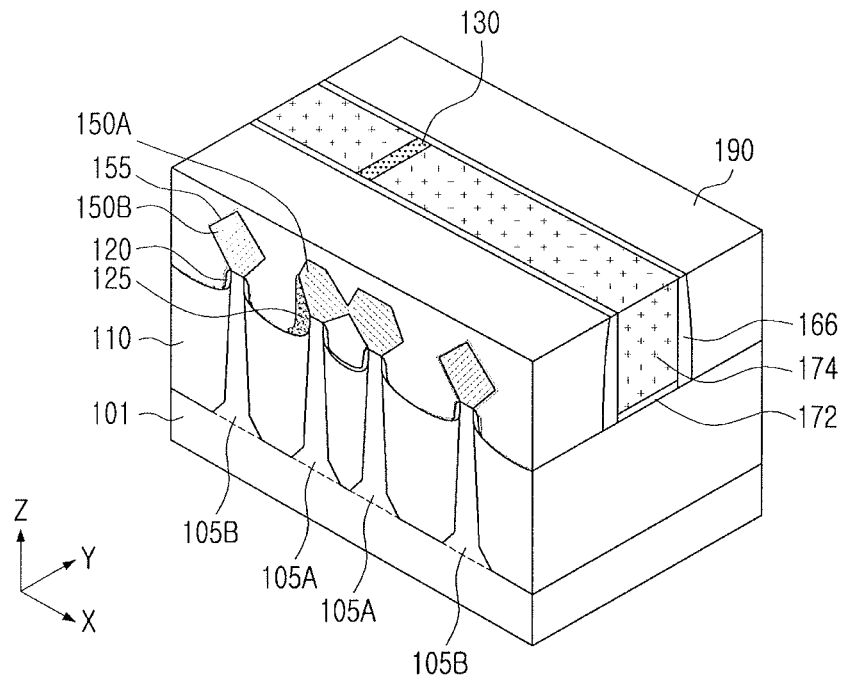
Figure 8L:
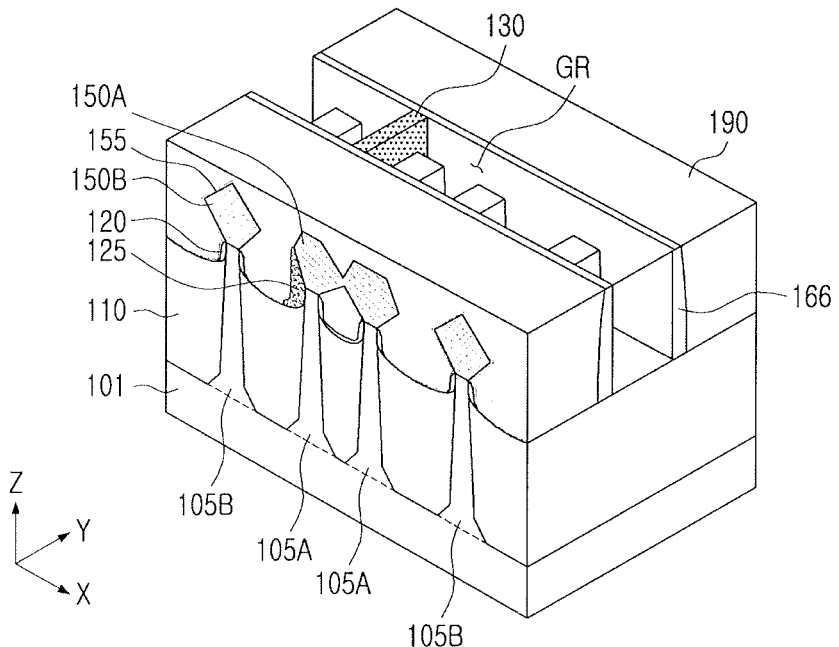
Figure 8M:
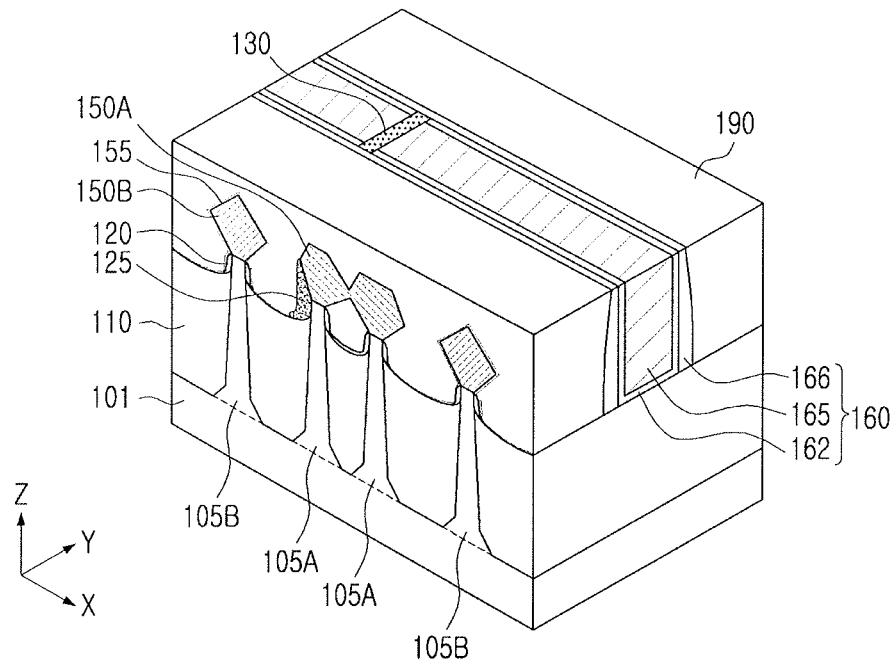
Figure 8N:
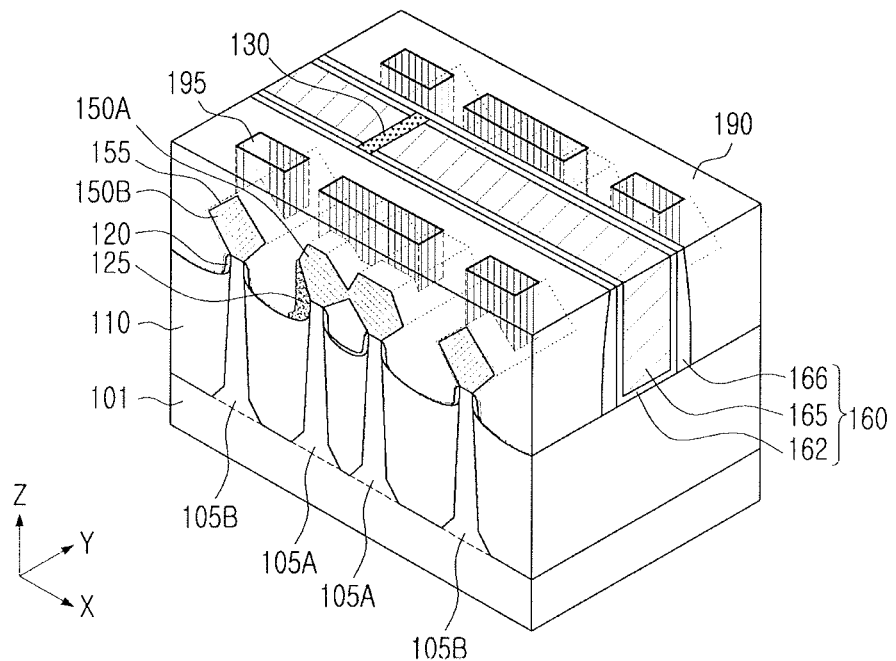

FIGS. 8A to 8N are process diagrams of stages in a method of fabricating a semiconductor device according to example embodiments.

Referring to FIG. 8A, the substrate 101 may be patterned to form trench areas TI defining first and second active fins 105A and 105B.

First, a pad oxide pattern 142 and a mask pattern 144 may be formed on the substrate 101. The pad oxide pattern 142 may be a layer protecting top surfaces of the first and second active fins 105A and 105B, and may be omitted in some example embodiments. The mask pattern 144 may be formed to pattern the substrate 101, and may include, e.g., silicon nitride, a carbon-containing material, or the like. The mask pattern 144 may have a multilayer structure.

The trench areas TI may be formed by anisotropically etching the substrate 101 using the pad oxide pattern 142 and the mask pattern 144. Since the trench areas TI have a high aspect ratio, widths of the trench areas TI may decrease toward bottoms of the trench areas TI. Accordingly, widths of the first and second active fins 105A and 105B may decrease toward tops of the first and second active fins 105A and 105B.

Referring to FIG. 8B, the device isolation layer 110 filling the trench areas TI may be formed.

First, the trench areas TI may be filled with an insulating material and planarized. During the planarization process, at least a portion of the pad oxide pattern 142 and mask pattern 144 may be removed. In some example embodiments, a relatively thin liner may be formed in the trench areas TI before filling the trench areas TI with the insulating material.

Next, the first and second active fins 105A and 105B may protrude onto the device isolation layer 110 by partially removing the insulating material filling the trench areas TI from above. For example, the process may be a wet-etching process using at least a portion of the pad oxide pattern 142 as an etching mask. As a result, the first and second active fins 105A and 105B may protrude onto, e.g., above an upper surface of, the device isolation layer 110 to a predetermined height. The height of the first and second active fins 105A and 105B protruding onto the device isolation layer 110 may be variously modified according to example embodiments. During the etching process, the pad oxide pattern 142 may be removed.

Referring to FIG. 8C, first and second sacrificial layers 172 and 174 may be formed on the first and second active fins 105A and 105B and the device isolation layer 110.

The first and second sacrificial layers 172 and 174 may be a sacrificial gate structure replaced with the gate dielectric layer 162 and the gate electrode 165 illustrated in FIG. 1 in subsequent processes. The first and second sacrificial layers 172 and 174 may be an insulating material and a conductive material, respectively, but are not limited thereto. For example, the first sacrificial layer 172 may include silicon oxide, and the second sacrificial layer 174 may include polysilicon. The first and second sacrificial layers 172 and 174 may be formed as a single layer.

Referring to FIG. 8D, the first and second sacrificial layers 172 and 174 may be patterned using a mask patterning layer 176.

The mask patterning layer 176 may include silicon oxide or silicon nitride. By the patterning process, the first and second sacrificial layers 172 and 174 may have a line shape intersecting the first and second active fins 105A and 105B and extending in the x-direction.

Referring to FIG. 8E, a spacer-forming layer SR may be formed on the first and second active fins 105A and 105B, the device isolation layer 110, and the mask patterning layer 176.

The spacer-forming layer SR may be conformally formed on top surfaces and/or side surfaces of the first and second active fins 105A and 105B, the device isolation layer 110, the first and second sacrificial layers 172 and 174, and the mask patterning layer 176. The spacer-forming layer SR may be formed of a low-k material. For example, the spacer-forming layer SR may include at least one of SiO, SiN, SiCN, SiOC, SiON, and SiOCN.

Referring to FIG. 8F, a first mask layer 182 covering the first active fins 105A may be formed, and the second active fins 105B exposed by the first mask layer 182 may be recessed. That is, the first mask layer 182 may be positioned to, e.g., completely, cover the first active fins 105A, thereby exposing the second active fins 105B for further processing.

First, the first mask layer 182 may be formed to cover the first active fins 105A and expose only the second active fins 105B. The first mask layer 182 may be, e.g., a photoresist layer.

Next, the spacer-forming layer SR may be removed from top surfaces of the second active fins 105B to expose the top surfaces of the second active fins 105B, and the exposed second active fins 105B may further be recessed from the top to a predetermined depth. For example, the recess process may be performed sequentially using a dry-etching process and a wet-etching process. For example, as illustrated in FIG. 8F, the recess process may include etching only parts of the spacer-forming layer SR and the second active fins 105B, e.g., via dry etching at an angle in a direction oriented from the first mask layer 182 down, so portions, e.g., only thin layers, of the spacer-forming layer SR on sidewalls of the etched second active fins 105B may be remain to define the spacers 120.

After the recess process, the second active fins 105B may have a smaller height than the first active fins 105A. As necessary, surfaces of the recessed second active fins 105B may be cured in an additional process performed after the recess forming process. Before or after the recess forming process, a process of injecting impurities into the second active fins 105B may be performed. The impurity injection process may be performed using the first mask layer 182 and the spacers 120 as a mask layer.

As discussed previously, the spacer-forming layer SR may be partially removed during the process of exposing the top surfaces of the second active fins 105B and the process of recessing the second active fins 105B. That is, the spacer-forming layer SR may be partially removed in the process of exposing the top surfaces of the second active fins 105B and further removed in the process of recessing the second active fins 105B. In particular, the spacer-forming layer SR may be removed relatively more in a horizontally deposited region and relatively less in a direction parallel to the z-direction, e.g., due to isotropic etching at an angle. Thus, the spacer-forming layer SR may form the spacers 120 on sidewalls of the second active fins 105B, and gate spacers 166 on side surfaces of the first and second sacrificial layers 172 and 174 and mask patterning layer 176. In some example embodiments, an etchback process may be undertaken on the spacer-forming layer SR before the first mask layer 182 is formed. In this case, the spacers 120 and the gate spacers 166 may be formed before the first mask layer 182 is formed.

Referring to FIG. 8G, the second source/drain areas 150B may be formed on the recessed second active fins 105B.

The second source/drain areas 150B may be formed using a selective epitaxial growth (SEG) process, for example. The second source/drain areas 150B may be, e.g., a silicon germanium (SiGe) layer. When silicon germanium (SiGe) is grown on the second active fins 105B formed of silicon (Si), a compressive stress may be generated in channel areas of the second transistors TR2 (refer to FIG. 1). In some example embodiments, before the second source/drain areas 150B are formed, a region in which germanium (Ge) is distributed at a relatively low concentration may be formed as a buffer layer for reducing the occurrence of defects due to a difference in lattice constants between the second active fins 105B and the second source/drain areas 150B. Impurities, e.g., boron (B), may be doped in-situ during the growth of the second source/drain areas 150B, or may be injected in an additional process after the growth of the second source/drain areas 150B. In the growth process, the second source/drain areas 150B may be grown on a crystallographically stable plane to form a pentagonal or similar shape as illustrated in FIG. 8G, but are not limited thereto.

Referring to FIG. 8H, a passivation layer 155 may be formed to cover surfaces of the second source/drain areas 150B, and a second mask layer 184 may be formed to cover the second active fins 105B.

First, the first mask layer 182 may be removed and the passivation layer 155 covering the surfaces of the second source/drain areas 150B may be formed. The passivation layer 155 may serve to protect the surfaces of the second source/drain areas 150B and suppress additional growth of the second source/drain areas 150B. The passivation layer 155 may be formed of, e.g., silicon nitride.

Next, the second mask layer 184 may be formed to cover the second active fins 105B and only expose the first active fins 105A. The second mask layer 184 may be formed of the same material as the first mask layer 182. For example, the second mask layer 184 may be a photoresist layer. A distance D5 between an end of the second mask layer 184 and a left first active fin 105A may be smaller than a distance D6 between an end of the second mask layer 184 and a right first active fin 105A. In other words, as illustrated in FIG. 8H, a distance between a right outer sidewall of the second mask layer 184 facing a left first active fin 105A and an outer left surface of the spacer-forming layer SR on the left first active fin 105A (i.e., distance D5) may be smaller than a distance between a left outer sidewall of the second mask layer 184 facing a right first active fin 105A and an outer right surface of the spacer-forming layer SR on the right first active fin 105A (i.e., distance D6).

In detail, the width of the second mask 184 in the x-direction may be adjusted in accordance with a desired location of the blocking layer 125, thereby providing a sufficiently small distance in predetermined regions between the second mask 184 and the first active fins 105A to form the blocking layer 125 therein, as will be described in more detail below. For example, referring to FIG. 8H, the width of the second mask 184 in the x-direction may be adjusted to have the distance D5 smaller than the distance D6 in order to subsequently form the blocking layer 125 within the smaller distance D5, as will be described in more detail below. By forming the second mask layer 184 to have the different distances D5 and D6 from the first active fins 105A, the blocking layer 125 may be subsequently formed only on one side surface of the first active fins 105A, i.e., only on one side surface of the left first active fin 105A within the area of the smaller distance D5, as will be discussed in detail below with reference to FIG. 8I.

Referring to FIG. 8I, the first active fins 105A with the portion of the spacer-forming layer SR thereon, both of which are exposed by the second mask layer 184, may be recessed to form the blocking layer 125.

In detail, the spacer-forming layer SR disposed on the top surfaces of the first active fins 105A may be removed to expose the top surfaces of the first active fins 105A, and the exposed first active fins 105A may be recessed further by a predetermined depth from the top to form recessed first active fins 105A. The recess process may be similar to the process of recessing the second active fins 105B described above with reference to FIG. 8F. Accordingly, the spacer-forming layer SR may be partially removed to, e.g., simultaneously, form the spacers 120 on sidewalls of the recessed first active fins 105A, and the gate spacers 166 on the side surfaces of the first and second sacrificial layers 172 and 174 and the mask patterning layer 176. The spacers 120 may be connected to each other between the recessed first active fins 105A because a space between the first active fins 105A is relatively narrow, but are not limited thereto. In addition, the passivation layer 155 exposed by the second mask layer 184 may be removed.

However, the spacer-forming layer SR may be only slightly removed from a left side surface of the left first active fin 105A having a relatively small distance from the second mask layer 184 (i.e., distance D5 in FIG. 8H), thereby forming the blocking layer 125. That is, since a space between the first active fin 105A and the second mask layer 184 is relatively narrow at the left side of the left first active fin 105A (i.e., distance D5 in FIG. 8H), the etchant may not flow into such a narrow space. Accordingly, referring to FIG. 8I, while the etchant in the recess process may remove portions of the spacer-forming layer SR and of the first active fins 105A to the right of the blocking layer 125 in FIG. 8I, a part of the spacer-forming layer SR within the narrow space to the left of the leftmost first active fin 105A in FIG. 8I (i.e., distance D5 in FIG. 8H) remains to define the blocking layer 125. For example, the part of the spacer-forming layer SR within the narrow space to the left of the leftmost first active fin 105A in FIG. 8I may remain mostly unetched due to the small distance D5, so the resultant blocking layer 125 may have a height similar to an initial height of the spacer-forming layer SR.

For example, as illustrated in FIG. 8I, the blocking layer 125 may have a height and a lower width similar to those of the spacer-forming layer SR, e.g., due to the small distance D5 to the left of the first active fin 105A not allowing etchant access, while the spacer-forming layer SR on the right side surface of the first active fin 105A may be removed, e.g., due to the relatively larger amount of etchant flowing into the larger space (i.e., larger distance D6), thereby forming the blocking layer 125 with a narrow upper width and an inclined right side surface declining from the top of the blocking layer 125 toward the top surface of the recessed first active fin 105A. In other words, referring to FIG. 8I, as the etchant flows at an angle (e.g., via isotropic etching) from the left second mask layer 184 toward a space between the two second mask layers 184, and as the distance D5 (FIG. 8H) is much smaller than the distance between the two first active fins 105A and than the distance D6, the majority of the spacer-forming layer SR within the distance D5 remains, while the two first active fins 105A and the spacer-forming layer SR thereon are etched, thereby causing the blocking layer 125 to extend above the top surface of the recessed first active fins 105A. For example, as illustrated in FIGS. 8H-8I, both the first active fin 105A and the spacer-forming layer SR to the right of the blocking layer 125 are etched, e.g., the leftmost first active fin 105A in FIG. 8I is etched to remove its edge and reduce its height, to have the blocking layer 125 extend above its top surface.

For example, referring to FIGS. 2A and 8I, a total blocking layer height $H_T$ may equal the sum of H1 discussed previously and a height h of the recessed first and second active fins 105A and 105B, as illustrated in FIG. 2A, e.g., $H_T$=H1+h. For example, the height H1 may be about 3 nm to about 12 nm.

Figure 8O:
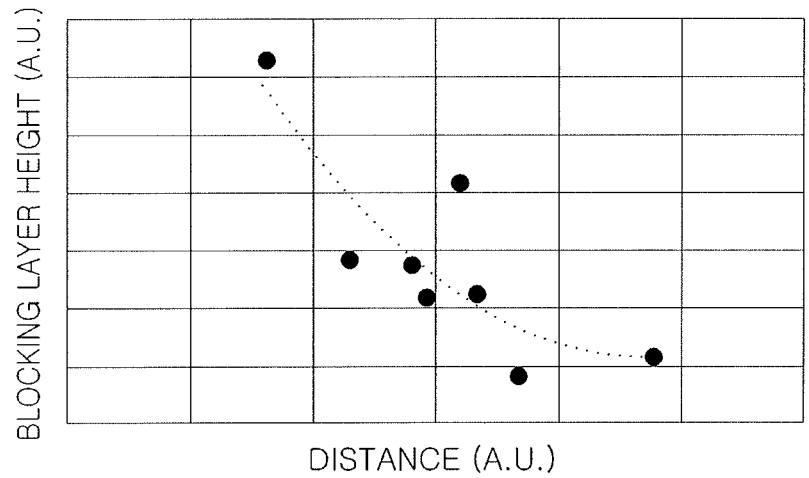

However, embodiments are not limited thereto. For example, the height and length of the blocking layer 125 may be variously changed according to a shape and arrangement of the second mask layer 184. For example, the widths of the second mask layers 184 may be controlled to adjust the distances D5 and D6 to desired values, so the height of the blocking layer 125 may be controlled, e.g., the total height $H_T$ of the blocking layer 125 increases with a decreasing distance D5 (FIG. 8O). For example, the left second mask layer 184 in FIG. 8I may cover at least half a as the distance D5 increases the height of the blocking layer 125 may be reduced. For example, the left second mask layer 184 in FIG. 8I may cover at least half a distance between the leftmost first active fin 105A and the adjacent second active fin 105B be controlled to adjust the distances D5

Referring to FIG. 8J, first source/drain areas 150A may be formed on the recessed first active fins 105A.

The first source/drain areas 150A may be formed in a process similar to the process of forming the second source/drain areas 150B described above with reference to FIG. 8G. For example, the first source/drain areas 150A may be formed using the selective epitaxial growth (SEG) process. The first source/drain areas 150A may be, e.g., a silicon (Si) layer. Impurities, e.g., phosphorus (P), may be doped in-situ during the growth of first source/drain areas 150A, or may be injected in an additional process after the growth of the first source/drain areas 150A.

As illustrated in FIG. 8J, the first source/drain areas 150A respectively grown from two adjacent first active fins 105A may merge, e.g., grow toward each other and connect to each other to form the shape illustrated in FIG. 8J. In the growth process, the first source/drain areas 150A may be grown on a crystallographically stable plane to form a hexagonal or similar shape as illustrated in FIG. 8J, but are not limited thereto.

However, in the process of growing the first source/drain areas 150A, an area in contact with the blocking layer 125 may be suppressed from growing by the blocking layer 125. For example, as illustrated in FIG. 8J, the right side of the first source/drain area 150A on the leftmost first active fin 105A may grow farther along the x-direction than its left side that contacts the blocking layer 125, thereby forming an asymmetric structure. For example, the growth of the first source/drain area 150A in the area not in contact with the blocking layer 125 (the right side of the first source/drain area 150A on the leftmost first active fin 105A) may be the same as or similar to that as the first source/drain area 150A on other first active fins 105A, e.g., as on the rightmost first active fin 105A, while that in the area in contact with the blocking layer 125 is suppressed. Accordingly, the distance between the first source/drain areas 150A formed to be in contact with the blocking layer 125 and adjacent second source/drain areas 150B may be secured.

Referring to FIG. 8K, an interlayer insulating layer 190 may be formed on the first and second source/drain areas 150A and 150B, and the gate isolation layer 130 may be formed.

First, the second mask layer 184 may be removed to form the interlayer insulating layer 190. The interlayer insulating layer 190 may be formed by depositing an insulating material to cover the first and second source/drain areas 150A and 150B, the mask patterning layer 176, and the gate spacers 166, and exposing a top surface of the second sacrificial layer 174 by a planarization process. Accordingly, the mask patterning layer 176 may be removed in this process. The interlayer insulating layer 190 may include, e.g., at least one of an oxide, a nitride, and an oxynitride, and a low-k material.

Next, the gate isolation layer 130 extending in the y-direction and separating second sacrificial layers 174 into right and left layers in the x-direction may be formed. The gate isolation layer 130 may be formed by forming an additional mask layer to partially remove the second sacrificial layer 174 and depositing a material forming the gate isolation layer 130 into a resultant space. For example, the gate isolation layer 130 may be formed of a different material from the second sacrificial layer 174 and the same material as the interlayer insulating layer 190, but is not limited thereto. In some example embodiments, the gate isolation layer 130 may have a line shape extending in the y-direction. In some example embodiments, the gate isolation layer 130 may be formed in another process, e.g., before forming the interlayer insulating layer 190 or after forming the gate structure 160 (refer to FIG. 1).

Referring to FIG. 8L, the first and second sacrificial layers 172 and 174, that is, the sacrificial gate structure, may be removed.

The first and second sacrificial layers 172 and 174 may be removed selectively with respect to the device isolation layer 110 and first and second active fins 105A and 105B disposed therebelow, to form an opening GR exposing the device isolation layer 110 and the first and second active fins 105A and 105B. The process of removing the first and second sacrificial layers 172 and 174 may be undertaken using at least one of a dry etching process and a wet etching process.

Referring to FIG. 8M, the gate dielectric layer 162 and the gate electrode 165 may be formed in the opening GR, thereby finally forming the gate structure 160.

The gate dielectric layer 162 may be substantially conformally formed along a sidewall and a bottom surface of the opening GR. The gate dielectric layer 162 may include, e.g., an oxide, a nitride, or a high-k material. The gate electrode 165 may be formed to fill an inner space formed by the gate dielectric layer 162. The gate electrode 165 may include, e.g., a metal or a semiconductor material. After forming the gate dielectric layer 162 and the gate electrode 165, materials remaining on the interlayer insulating layer 190 may be removed using a planarization process, e.g., a chemical mechanical polishing (CMP) process.

Referring to FIG. 8N, contact holes may be formed by patterning the interlayer insulating layer 190, and contact plugs 195 may be formed by filling the contact holes with a conductive material.

First, the contact holes may be formed by removing portions of the interlayer insulating layer 190 disposed at each side of the gate structure 160 using an additional mask layer, e.g., a photoresist pattern. The contact holes may have bottom surfaces curved along top surfaces of the first and second source/drain areas 150A and 150B. When removing the interlayer insulating layer 190, upper portions of the first and second source/drain areas 150A and 150B may be partially recessed.

Next, the contact plugs 195, electrically connected to the first and second source/drain areas 150A and 150B, may be formed by depositing the conductive material in the contact holes. In some example embodiments, the shape and arrangement of the contact plugs 195 may be variously modified.

Figure 9:
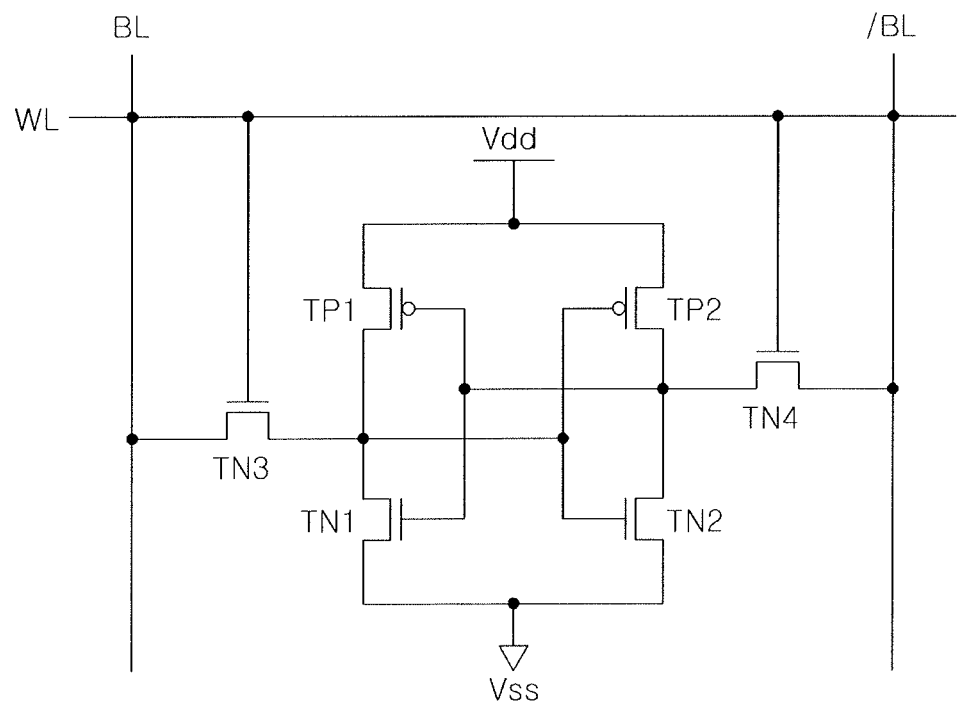
FIG. 9 illustrates a circuit diagram of a static random access memory (SRAM) cell including a semiconductor device according to example embodiments.

FIG. 9 is a circuit diagram illustrating a static read access memory (SRAM) cell including a semiconductor device according to example embodiments.

Referring to FIG. 9, a single cell in the SRAM device may include first and second driver transistors TN1 and TN2, first and second load transistors TP1 and TP2, and first and second access transistors TN3 and TN4. Here, sources of the first and second driver transistors TN1 and TN2 may be connected to a ground voltage line Vss, and sources of the first and second load transistors TP1 and TP2 may be connected to a power voltage line Vdd.

The first driver transistor TN1 consisting of an NMOS transistor and the first load transistor TP1 consisting of a PMOS transistor may configure a first inverter, and the second driver transistor TN2 consisting of an NMOS transistor and the second load transistor TP2 consisting of a PMOS transistor may configure a second inverter NMOS. At least one of the first and second driver transistors TN1 and TN2, the first and second load transistors TP1 and TP2, and the first and second access transistors TN3 and TN4 may include the semiconductor device according to the various embodiments.

Output terminals of the first and second inverters may be connected to sources of the first and second access transistors TN3 and TN4. In addition, input terminals and output terminals of the first and second inverters may be cross-connected with each other to form one latch circuit. In addition, drains of the first and second access transistors TN3 and TN4 may be connected to first and second bitlines BL and /BL, respectively.

Figure 10:
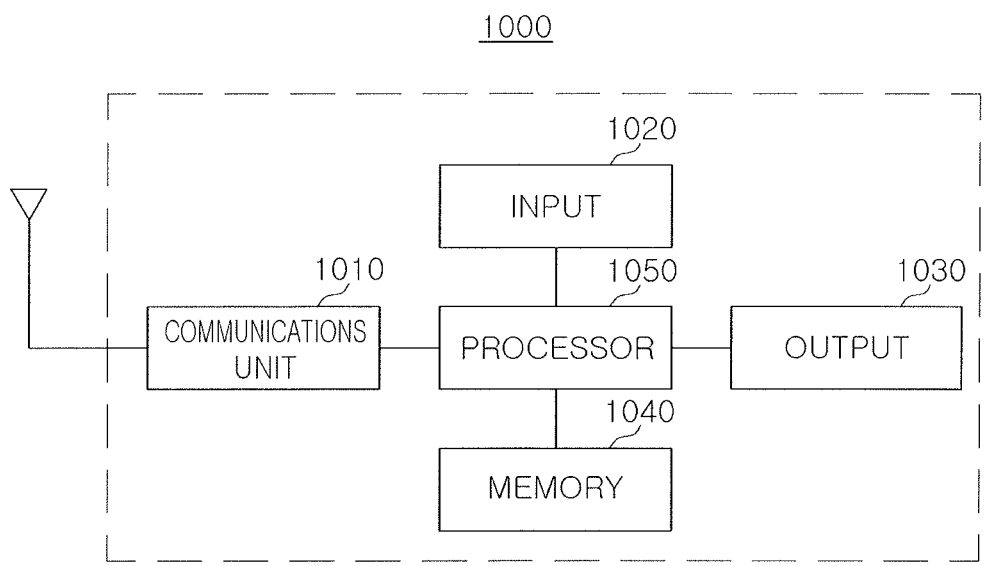
FIG. 10 illustrates a block diagram of an electronic apparatus including a semiconductor device according to example embodiments.

FIG. 10 is a block diagram illustrating an electronic apparatus including a semiconductor device according to example embodiments.

Referring to FIG. 10, an electronic apparatus 1000 according to the example embodiments may include a communications unit 1010, an input 1020, an output 1030, a memory 1040, and a processor 1050.

The communications unit 1010 may include a wired/wireless communications module, e.g., a wireless internet module, a short-range communications module, a GPS module, or a mobile communications module. The wired/wireless communications module included in the communications unit 1010 may be connected to an external communications network by a variety of communications standards to transmit and receive data.

The input 1020 is a module supplied to a user to control operations of the electronic apparatus 1000, and may include, e.g., a mechanical switch, a touchscreen, a voice recognition module, or the like. In addition, the input 1020 may include, e.g., a trackball, a laser pointer mouse, or a finger mouse, and may further include a variety of sensor modules in which a user can input data.

The output 1030 may output information processed by the electronic apparatus 1000 in an audio or video form. The memory 1040 may store a program for processing or controlling the processor 1050, data, or the like. The processor 1050 may write data or read data by transmitting a command to the memory 1040 according to a required operation.

The memory 1040 may be embedded in the electronic apparatus 1000, or may communicate with the processor 1050 via a separate interface. When the memory 1040 communicates with the processor 1050 via the separate interface, the processor 1050 may write data to, or read data from, the memory 1040 using a variety of interface standards, e.g., secure digital (SDSC), secure digital high capacity (SDHC), secure digital extended capacity (SDXC), MICRO SD, or universal serial bus (USB).

The processor 1050 may control operations of each unit included in the electronic apparatus 1000. The processor 1050 may perform controlling or processing operations related to voice calls, video calls, or data communication, or may control or process operations for multimedia playback and management. In addition, the processor 1050 may process an input transmitted via the input 1020 from a user, and then output a result thereof via the output 1030. Further, the processor 1050 may write data required to control operations of the electronic apparatus 1000 to the memory 1040, or read data from the memory 1040, as described above. At least one of the processor 1050 and the memory 1040 may include the semiconductor device according to the various example embodiments described above with reference to FIGS. 1 to 7.

Figure 11:
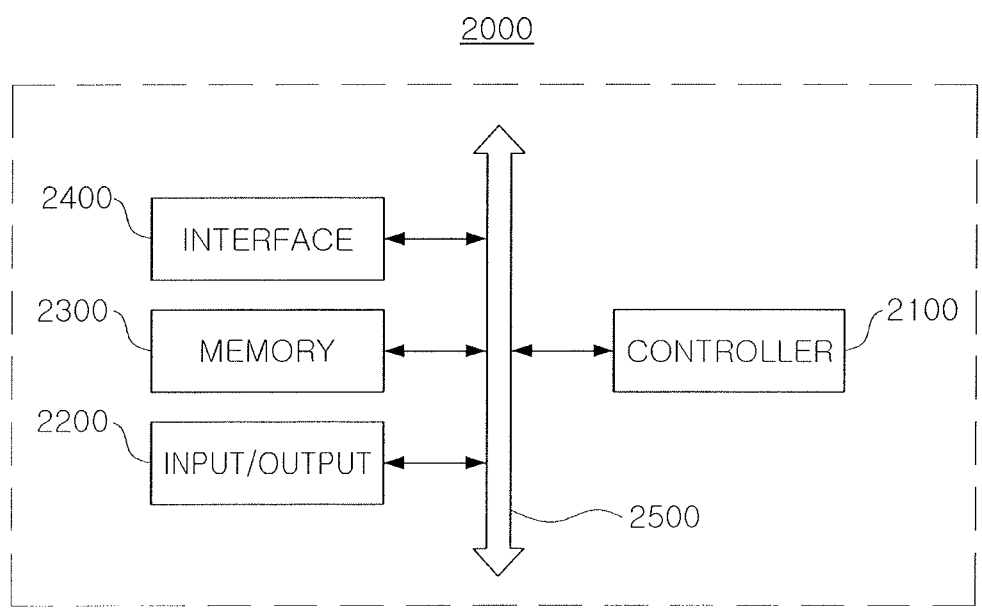
FIG. 11 illustrates a schematic diagram of a system including a semiconductor device according to example embodiments.

FIG. 11 is a schematic diagram illustrating a system including a semiconductor device according to example embodiments.

Referring to FIG. 11, a system 2000 may include a controller 2100, an input/output 2200, a memory 2300, and an interface 2400. The system 2000 may be a mobile system or an information transmitting or receiving system. The mobile system may be, e.g., a PDA, a portable computer, a web tablet, a wireless phone, a mobile phone, a digital music player, or a memory card.

The controller 2100 may function to execute a program or control the system 2000. The controller 2100 may be, e.g., a microprocessor, a digital signal processor, a microcontroller, or the like.

The input/output 2200 may be used to input data to the system 2000 or output data from the system 2000. The system 2000 may be connected to an external device, e.g., a personal computer or a network, through the input/output 2200 to exchange data with the external device. The input/output 2200 may be, e.g., a keypad, a keyboard, or a display.

The memory 2300 may store code and/or data for operating the controller 2100, and/or data processed in the controller 2100.

The interface 2400 may be a data transmission path between the system 2000 and an external device. The controller 2100, the input/output 2200, the memory 2300, and the interface 2400 may communicate through a bus 2500.

At least one of the controller 2100 and the memory 2300 may include the semiconductor device according to the various example embodiments described above with reference to FIGS. 1 to 7.

By way of summation and review, a shape of source/drain areas may be controlled by a blocking layer, and thereby a semiconductor device having improved reliability may be provided. That is, according to embodiments, a blocking layer is formed on at least one side of the source/drain areas in order to suppress growth of the source/drain area toward an adjacent source/drain area, thereby ensuring a margin between the adjacent source/drain areas. Such a blocking layer may be formed by adjusting a distance between a mask layer and an active fin during a manufacturing process to form the blocking layer from a same initial layer as the spacers.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   first, second, third, and fourth fin patterns sequentially disposed in a first direction on a substrate;
   at least one gate electrode intersecting the first, second, third, and fourth fin patterns;
   first, second, third, and fourth source/drain regions on upper surfaces of the first, second, third, and fourth fin patterns, respectively, the second and third source/drain regions being in contact with each other to define a merged source/drain region;
   a blocking layer on an outer sidewall of the second fin pattern opposing an inner sidewall of the second fin pattern facing the third fin pattern, the blocking layer extending above the upper surface of the second fin pattern and being in direct contact with an outer side surface of the second source/drain region opposing an inner side surface of the second source/drain region facing the third source/drain region; and
   spacers on the inner sidewall of the second fin pattern and both sidewalls each of the first, third, and fourth fin patterns, the spacers extending to a same height level as the first, second, third, and fourth fin patterns or lower and having a height lower than a height of the blocking layer,
   wherein the merged source/drain region has an asymmetric shape based on a center of the merged source/drain region in the first direction, and
   upper surfaces of the second and third source/drain regions are substantially flat.

2. The semiconductor device as claimed in claim 1, wherein a thickness of the blocking layer is greater than a thickness of the spacers.

3. The semiconductor device as claimed in claim 1, wherein the spacers on the inner sidewall of the second fin pattern and on an inner sidewall of the third fin pattern opposing an outer sidewall of the third fin pattern facing the fourth fin pattern are connected.

4. The semiconductor device as claimed in claim 1, wherein the second and third source/drain regions have different shapes to define the asymmetric shape of the merged source/drain region.

5. The semiconductor device as claimed in claim 1, wherein the second source/drain region has a maximum width smaller than a maximum width of the third source/drain region in the first direction.

6. The semiconductor device as claimed in claim 1, wherein the first and fourth source/drain regions are spaced apart from the merged source/drain region.

7. The semiconductor device as claimed in claim 6, wherein a distance between the first and second fin patterns is smaller than a distance between the third and fourth fin patterns.

8. The semiconductor device as claimed in claim 6, wherein a height of the merged source/drain region is lower than a height of each of the first and fourth source/drain regions.

9. The semiconductor device as claimed in claim 6, wherein the merged source/drain region defines a NMOS transistor, and the first and fourth source/drain regions define PMOS transistors.

10. The semiconductor device as claimed in claim 1, wherein each of the first and fourth source/drain regions has a vertex on an upper surface.

11. The semiconductor device as claimed in claim 1, wherein the outer side surface of the second source/drain region includes a first side being flush against the blocking layer and a second side extending upward directly from an upper end of the first side in a direction oriented toward an extension of a central vertical axis of the second fin pattern to form a vertex between the first side and the second side, and
   an upper end of the blocking layer is at substantially a same height level as a position of the vertex at which the second source/drain region has a maximum width in the first direction.

12. The semiconductor device as claimed in claim 1, further comprising an additional blocking layer on an outer sidewall of the third fin pattern facing the fourth fin pattern, a height of the additional blocking layer being different from a height of the blocking layer.

13. A semiconductor device, comprising:
   first and second fin patterns sequentially disposed in a first direction on a substrate;
   third and fourth fin patterns on the substrate, the first and second fin patterns being between the third and fourth fin patterns;
   at least one gate electrode intersecting the first and second fin patterns;
   first and second source/drain regions on upper surfaces of the first and second fin patterns, respectively, the first and second source/drain regions being in contact with each other to define a merged source/drain region;
   third and fourth source/drain regions on upper surfaces of the third and fourth fin patterns, respectively, the merged source/drain region being between the third and fourth source/drain regions and spaced apart from each of the third and fourth source/drain regions;
   a blocking layer on a first sidewall of the first fin pattern opposing a second sidewall of the first fin pattern facing the second fin pattern, the blocking layer extending above the upper surface of the first fin pattern and being in direct contact with a first side surface of the first source/drain region opposing a second side surface of the first source/drain region facing the second source/drain region; and
   spacers on the second sidewall of the first fin pattern and both sidewalls of the second fin pattern, the spacers extending to a same height level as the first and second fin patterns or lower and having a height lower than a height of the blocking layer,
   wherein the first source/drain region has a maximum width smaller than a maximum width of the second source/drain region in the first direction, and the merged source/drain region has an asymmetric shape based on a center of the merged source/drain region in the first direction, and wherein upper surfaces of the first and second source/drain regions are substantially flat, and each of the third and fourth source/drain regions has a vertex on an upper surface.

14. The semiconductor device as claimed in claim 13, wherein a height of the merged source/drain region is lower than a height of each of the third and fourth source/drain regions.

15. The semiconductor device as claimed in claim 13, wherein a thickness of the blocking layer is greater than a thickness of the spacers.

16. The semiconductor device as claimed in claim 13, wherein the first side surface of the first source/drain region includes a first side being flush against the blocking layer and a second side extending upward directly from an upper end of the first side in a direction oriented toward an extension of a central vertical axis of the first fin pattern to form a vertex between the first side and the second side, and an upper end of the blocking layer is at substantially a same height level as a position of the vertex at which the first source/drain region has the maximum width in the first direction.

17. A semiconductor device, comprising:

first and second fin patterns extending in a first direction on a substrate;

at least one gate electrode intersecting the first and second fin patterns and extending in a second direction;

first and second source/drain regions on upper surfaces of the first and second fin patterns, respectively, the first and second source/drain regions being in contact with each other to define a merged source/drain region;

a blocking layer on a first sidewall of the first fin pattern opposing a second sidewall of the first fin pattern facing the second fin pattern, the blocking layer extending above the upper surface of the first fin pattern and being in direct contact with a first side surface of the first source/drain region opposing a second side surface of the first source/drain region facing the second source/drain region; and spacers on the second sidewall of the first fin pattern and both sidewalls of the second fin pattern, the spacers extending to a same height level as the first and second fin patterns or lower and having a height lower than a height of the blocking layer, wherein the first side surface of the first source/drain region includes a first side being flush against the blocking layer and a second side extending upward directly from an upper end of the first side in a direction oriented toward an extension of a central vertical axis of the first fin pattern to form a vertex between the first side and the second side, and an upper end of the blocking layer is at substantially a same height level as a position of the vertex at which the first source/drain region has a maximum width in the second direction.

18. The semiconductor device as claimed in claim 17, the merged source/drain region has an asymmetric shape based on a center of the merged source/drain region in the second direction.

* * * * *